(12) United States Patent
Lee et al.

(10) Patent No.: US 9,159,924 B2
(45) Date of Patent: Oct. 13, 2015

(54) METHOD OF PREPARING CARBON THIN FILM, ELECTRONICS COMPRISING CARBON THIN FILM, AND ELECTROCHEMICAL DEVICE COMPRISING CARBON THIN FILM

(75) Inventors: Tae-Woo Lee, Pohang-si (KR); Hee Cheul Choi, Pohang-si (KR); Sun Jung Byun, Seongnam-si (KR)

(73) Assignee: POSTECH ACADEMY-INDUSTRY FOUNDATION, Pohang-Si, Kyungsangbuk-Do (KR)

( * ) Notice: Subject to any disclaimer, the term of this patent is extended or adjusted under 35 U.S.C. 154(b) by 180 days.

(21) Appl. No.: 13/187,671

(22) Filed: Jul. 21, 2011

(65) Prior Publication Data

US 2012/0021250 A1 Jan. 26, 2012

(30) Foreign Application Priority Data

Jul. 22, 2010 (KR) .................. 10-2010-0071062
Jul. 14, 2011 (KR) .................. 10-2011-0070032

(51) Int. Cl.
| | |
|---|---|
| C01B 31/04 | (2006.01) |
| H01L 51/00 | (2006.01) |
| B82Y 30/00 | (2011.01) |
| B82Y 40/00 | (2011.01) |
| C01B 31/02 | (2006.01) |
| H01M 4/583 | (2010.01) |
| H01M 4/86 | (2006.01) |
| H01M 8/02 | (2006.01) |
| H01L 51/52 | (2006.01) |

(52) U.S. Cl.
CPC ............. *H01L 51/0021* (2013.01); *B82Y 30/00* (2013.01); *B82Y 40/00* (2013.01); *C01B 31/02* (2013.01); *C01B 31/04* (2013.01); *C01B 31/0446* (2013.01); *H01M 4/583* (2013.01); *H01M 4/8605* (2013.01); *H01M 8/0234* (2013.01); *C01B 2204/02* (2013.01); *C01B 2204/04* (2013.01); *C01P 2002/02* (2013.01); *C01P 2006/40* (2013.01); *H01L 51/5203* (2013.01); *Y02E 10/549* (2013.01); *Y02E 60/122* (2013.01); *Y02E 60/50* (2013.01)

(58) Field of Classification Search
USPC ........................................................ 427/226
See application file for complete search history.

(56) References Cited

U.S. PATENT DOCUMENTS

| | | | | |
|---|---|---|---|---|
| 4,983,244 | A | * | 1/1991 | Murakami et al. ............ 156/224 |
| 6,022,518 | A | * | 2/2000 | Yamazaki et al. ............ 423/448 |
| 2005/0013935 | A1 | * | 1/2005 | Iijima et al. .................. 427/228 |

(Continued)

FOREIGN PATENT DOCUMENTS

| | | |
|---|---|---|
| JP | 2006-182603 | 7/2006 |
| JP | 2007-145631 | 6/2007 |

(Continued)

OTHER PUBLICATIONS

Byun, Sun-Jung, et al. "Graphenes Converted from Polymers", J. Phys. Chem. Lett. 2011, 2, pp. 493-497, American Chemical Society.

(Continued)

*Primary Examiner* — Robert Vetere
(74) *Attorney, Agent, or Firm* — Kile Park Reed & Houtteman PLLC

(57) ABSTRACT

A method of preparing a carbon thin film, and electronics including the carbon thin film.

19 Claims, 8 Drawing Sheets

(56) References Cited

U.S. PATENT DOCUMENTS

| | | | |
|---|---|---|---|
| 2005/0127334 A1* | 6/2005 | Shibata et al. | 252/502 |
| 2006/0182603 A1 | 8/2006 | Hawes | |
| 2007/0145631 A1 | 6/2007 | Salzmann | |
| 2008/0014426 A1* | 1/2008 | Nishikawa et al. | 428/220 |
| 2009/0068470 A1* | 3/2009 | Choi et al. | 428/403 |
| 2009/0068471 A1 | 3/2009 | Choi et al. | |
| 2009/0143799 A1 | 6/2009 | Smith et al. | |
| 2010/0062333 A1 | 3/2010 | Chuang et al. | |
| 2010/0092724 A1 | 4/2010 | Shiroya et al. | |
| 2011/0033677 A1* | 2/2011 | Shin et al. | 428/201 |
| 2011/0048625 A1* | 3/2011 | Caldwell et al. | 156/233 |

FOREIGN PATENT DOCUMENTS

| | | |
|---|---|---|
| JP | 2007-169148 | 7/2007 |
| JP | 2009-143799 | 7/2009 |
| JP | 2010-62333 | 3/2010 |
| KR | 10-2005-0040872 | 5/2005 |
| KR | 10-2009-0026568 | 3/2009 |
| KR | 10-2009-0027433 | 3/2009 |

OTHER PUBLICATIONS

Yanwu Zhu et al., "Graphene and Graphene Oxide: Synthesis, Properties and Applications", Advanced Materials, 2010, vol. 22, pp. 3906-3924.

Korean Office Action dated Nov. 14, 2012 for Korean Patent Application No. 10-2011-0070032 and English Translation thereof.

Marek Marcinek et al., "Microwave plasma chemical vapor deposition of graphitic carbon thin films"; Carbon 48 (2010) pp. 1552-1557.

Farima Agend et al., "Fabrication and Electrical Characterization of Electrospun Polyacrylonitrile-Derived Carbon Nanofibers"; Journal of Applied Polymer Science; vol. 106, 2007 pp. 255-259.

K.S. Novoselov et al., "Electric Field Effect in Atomically Thin Carbon Films"; Science, vol. 306, Oct. 22, 2004, pp. 666-669.

S. Y. Zhou et al., "Substrate-induced bandgap opening in epitaxial graphene"; Nature Materials, vol. 6, Oct. 2007, pp. 770-775.

Sungjin Park et al., "Chemical methods for the production of graphenes", Nature Nanotechnology, vol. 4, Mar. 2009, pp. 217-224.

Keun Soo Kim et al., "Large-scale pattern growth of graphene films for stretchable transparent electrodes"; Nature, vol. 457, Feb. 5, 2009, pp. 706-710.

* cited by examiner

METHOD OF PREPARING CARBON THIN FILM, ELECTRONICS COMPRISING CARBON THIN FILM, AND ELECTROCHEMICAL DEVICE COMPRISING CARBON THIN FILM

CROSS-REFERENCE TO RELATED PATENT APPLICATION

This application claims the benefit of Korean Patent Application No. 10-2010-0071062, filed on Jul. 22, 2010, and Korean Patent Application No. 10-2011-0070032, filed on Jul. 14, 2011, in the Korean Intellectual Property Office, the disclosures of which are incorporated herein in their entirety by reference.

BACKGROUND OF THE INVENTION

1. Field of the Invention

The present invention relates to a method of preparing a carbon thin film, electronics including the carbon thin film, and an electrochemical device including the carbon thin film.

2. Description of the Related Art

In general, carbonaceous materials may be classified into diamond, graphite, graphene, a-few-layer graphene (FLG), and amorphous carbon. While, diamond does not have electrical conductivity because its carbon atoms are connected to each other by $sp^3$ bonds, graphite has excellent electrical conductivity since its carbon atoms are connected to each other by $sp^2$ bonds. Meanwhile, since there are both $sp^3$ bonds and $sp^2$ bonds in amorphous carbon, amorphous carbon has lower electrical conductivity than graphite. Due to electrical conductivity similar to that of metal, the use of graphite is limited in the semiconductor industry. Graphene, which has drawn attention recently, has high electrical conductivity and high electron mobility, and thus, diverse research into graphene has been conducted due to its many potential uses in the semiconductor industry.

Carbonaceous materials having conductivity may be prepared by using a nano fiber or by separating graphene from graphite using a Scotch™ tape.

SUMMARY OF THE INVENTION

The present invention provides a method of preparing a cost-effective, stable, large-area, and two-dimensional carbon thin film.

The present invention also provides electronics and an electrochemical device including the carbon thin film prepared by using the method of preparing a carbon thin film.

According to an aspect of the present invention, there is provided a method of preparing a carbon thin film, the method including:

forming a polymer layer on a substrate by using a coating process;

forming a protective layer on the polymer layer; and heat-treating the substrate to form a carbon thin film on the substrate.

The substrate may include silicon, a silicon oxide, metal foils, stainless steel, a metal oxide, a highly ordered pyrolytic graphite (HOPG), hexagonal boron nitride (h-BN), a c-plane sapphire wafer, zinc sulfide (ZnS), a polymer substrate, or a combination of at least two of the foregoing. The substrate may also be any substrate having a crystalline structure. For example, the substrate may include Ni foil, Cu foil, Pd foil, MgO, ZnS, c-plane sapphire, h-BN, and the like.

A polymer of the polymer layer may include an insulating polymer that includes carbon and hydrogen, has a thermal decomposition temperature of 600° C. or less, and includes a non-conjugated main backbone.

For example, the polymer of the polymer layer may include at least one selected from the group consisting of a repeating unit represented by Formula 1 below, a repeating unit represented by Formula 2 below, and a repeating unit represented by Formula 3 below.

Formula 1

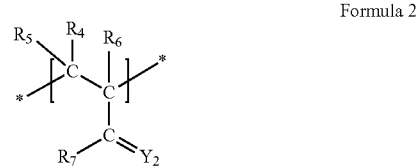

Formula 2

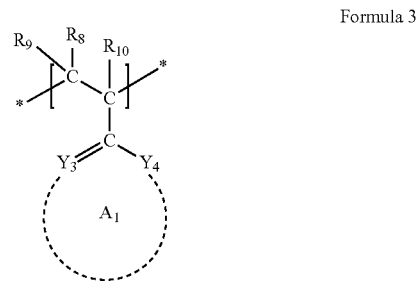

Formula 3

In Formulae 1 to 3, $Y_1$ is N or $C(R_{11})$;

$Y_2$ is O, S, $N(R_{12})$, or $C(R_{13})(R_{14})$;

$Y_3$ and $Y_4$ are each independently N or $C(R_{15})$;

$R_1$ to $R_{10}$ are each independently selected from the group consisting of a hydrogen atom (H), a nitro group ($-NO_2$), a cyano group ($-CN$), a hydroxyl group ($-OH$), a carboxyl group ($-COOH$), a halogen atom, a substituted or unsubstituted $C_1$-$C_{30}$ alkyl group, a substituted or unsubstituted $C_1$-$C_{30}$ alkoxy group, a substituted or unsubstituted $C_6$-$C_{30}$ aryl group, a substituted or unsubstituted $C_6$-$C_{30}$ arylalkyl group, a substituted or unsubstituted $C_6$-$C_{30}$ aryloxy group, a substituted or unsubstituted $C_2$-$C_{30}$ heteroaryl group, a substituted or unsubstituted $C_2$-$C_{30}$ heteroarylalkyl group, a substituted or unsubstituted $C_2$-$C_{30}$ heteroaryloxy group, a substituted or unsubstituted $C_5$-$C_{20}$ cycloalkyl group, a substituted or unsubstituted $C_2$-$C_{30}$ heterocycloalkyl group, a substituted or unsubstituted $C_1$-$C_{30}$ alkylester group, a substituted or unsubstituted $C_6$-$C_{30}$ arylester group, a substituted or unsubstituted $C_2$-$C_{30}$ heteroarylester group, and $-N(Q_1)(Q_2)$, wherein $Q_1$ to $Q_2$ are each independently selected from the group consisting of a hydrogen atom, a $C_1$-$C_{30}$ alkyl group, a $C_6$-$C_{30}$ aryl group, and a $C_2$-$C_{30}$ heteroaryl group;

$A_1$ is a substituted or unsubstituted $C_6$-$C_{30}$ aryl group or a substituted or unsubstituted $C_2$-$C_{30}$ heteroaryl group; and the * is a binding site with an adjacent repeating unit.

The forming the polymer layer may include providing a first mixture comprising the polymer and a solvent or a second mixture including a precursor of the polymer and a solvent to the substrate by using a coating process.

The protective layer may include a material having a melting point of 800° C. or higher. For example, the protective layer may include at least one selected from the group consisting of metal, a metal oxide, ceramic, a semiconductor oxide, and a semiconductor nitride.

The thickness of the protective layer may be in the range of 2 to 2000 nm.

In the preparing of the carbon thin film, the heat-treatment may be performed under conditions where polymers contained in the polymer layer are carbonized.

The heat-treatment may be performed in an inert or vacuum atmosphere at a temperature in the range of a thermal decomposition temperature of a polymer contained in the polymer layer to 2500° C. for and 30 seconds to 5 days.

The method may further include at least one step selected from the group consisting of patterning the protective layer and/or polymer layer in order to have desired micro- or nano-scale patterns before performing the heat-treatment and patterning the carbon thin film in order to have desired micro- or nano-scale patterns after performing the heat-treatment.

The carbon thin film may be selected from the group consisting of a graphite sheet, a graphene sheet, a-few-layer graphene, and an amorphous carbon sheet.

The method may further include forming a catalyst layer on the substrate before forming the polymer layer. In this regard, the catalyst layer may include nickel (Ni), cobalt (Co), iron (Fe), gold (Au), aluminum (Al), chromium (Cr), copper (Cu), magnesium (Mg), molybdenum (Mo), rhodium (Rh), silicon (Si), tantalum (Ta), titanium (Ti), tungsten (W), uranium (U), vanadium (V), zirconium (Zr), or a combination of at least two of the foregoing.

The method may further include stabilizing the polymer layer by pre-heat-treating the polymer layer before forming the protective layer.

The method may further include removing the protective layer and/or the catalyst layer after forming the carbon thin film.

The method may further include removing the catalyst layer after forming the carbon thin film.

The method may further include transferring the prepared carbon thin film to another substrate.

According to another aspect of the present invention, there are provided electronics including the carbon thin film prepared by using the method of preparing a carbon thin film. The carbon thin film may be used as an electrode, a wiring, and/or an active layer of various electronics, e.g., an active layer of a semiconductor device.

According to another aspect of the present invention, there is provided an electrochemical device including the carbon thin film prepared by using the method of preparing a carbon thin film.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, the present invention will now be described more fully with reference to the accompanying drawings, in which exemplary embodiments of the invention is shown.

Figure 1:
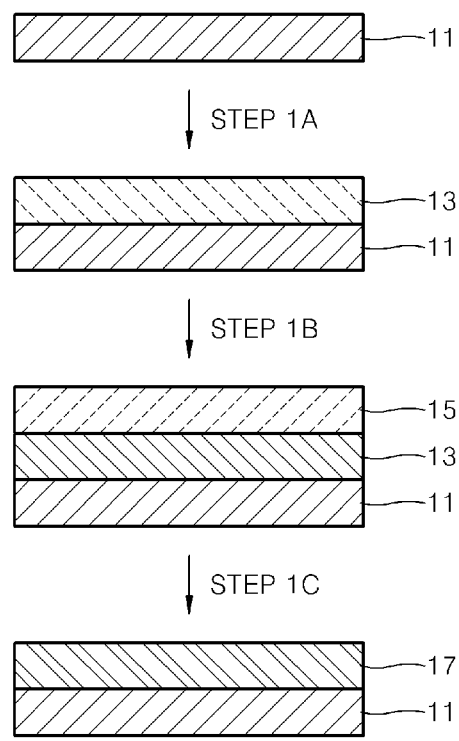
FIG. 1 is a diagram for describing a method of preparing a carbon thin film, according to an embodiment.

FIG. 1 is a diagram for describing a method of preparing a carbon thin film according to an embodiment. Referring to FIG. 1, the method of preparing a carbon thin film will be described.

First, a substrate 11 is prepared. The substrate 11 may include a material that does not substantially react with a polymer layer 13 that will be formed on the substrate 11 and is not deformed or does not deteriorate at a high temperature.

The substrate 11 may be any substrate that is commonly used in a semiconductor process. For example, the substrate 11 may include silicon, a silicon oxide such as $SiO_2$, a silicon nitride such as SiN, a semiconductor nitride such as GaN, metal foils such as copper foil, aluminum foil, nickel foil, and palladium foil, and stainless steel, a metal oxide, a highly ordered pyrolytic graphite (HOPG), hexagonal boron nitride (h-BN), a c-plane sapphire wafer, zinc sulfide (ZnS), a polymer substrate, or a combination of at least two of the foregoing. The metal foil may include a material that has a high melting point and does not act as a catalyst capable of forming the carbon thin film such as aluminum foil, or a material acting as a catalyst capable of forming the carbon thin film such as copper foil and nickel foil. The metal oxide may include aluminum oxide, molybdenum oxide, magnesium oxide, and indium tin oxide, and the polymer substrate may include kapton foil, polyethersulphone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), cellulose acetate propionate (CAP), and the like, but is not limited thereto.

If the metal foil acting as a catalyst capable of forming the carbon thin film such as Cu, Ni, and Pd is used to form the substrate 11 in order to facilitate the carbonization of the polymer layer 13, a step of forming a catalyst layer on the substrate 11 may not be performed.

If highly ordered pyrolytic graphite (HOPG), hexagonal boron nitride (h-BN), c-plane sapphire wafer, or zinc sulfide (ZnS) is used to form the substrate 11, a carbon thin film may be formed without forming a catalyst layer on the substrate 11 (The catalyst layer will be described with reference to FIG. 2).

The substrate 11 may have a single-layered structure including one material or a combination of at least two different materials or a multi-layered structure in which at least two layers, each of which includes a single material, are stacked. For example, the substrate 11 may have a double layered structure including a silicon layer and a silicon oxide layer.

Then, Step 1A in which the polymer layer 13 is formed on the substrate 11 is performed. Step 1A is performed by using a coating process.

A polymer of the polymer layer 13 may include an insulating polymer that includes carbon and hydrogen, has a thermal decomposition temperature of 600° C. or less, and includes a non-conjugated main chain.

In particular, the polymer of the polymer layer 13 may include at least one selected from the group consisting of a repeating unit represented by Formula 1 below, a repeating unit represented by Formula 2 below, and a repeating unit represented by Formula 3 below.

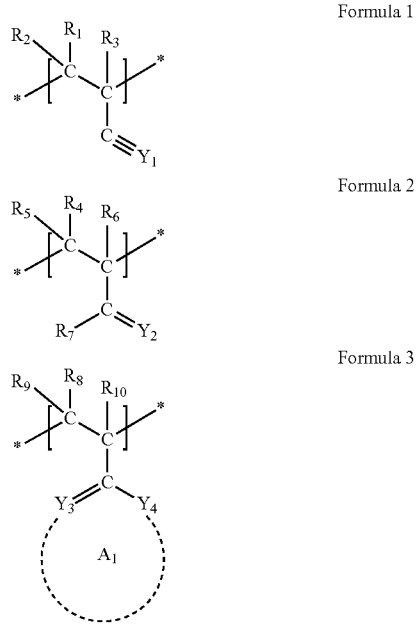

Formula 1

Formula 2

Formula 3

In Formula 1, $Y_1$ may be N or $C(R_{11})$. In Formula 2, $Y_2$ may be O, S, $N(R_{12})$, or $C(R_{13})(R_{14})$. In Formula 3, $Y_3$ and $Y_4$ may be each independently N or $C(R_{15})$, and $A_1$ may be a substituted or unsubstituted $C_6$-$C_{30}$ aryl group or a substituted or unsubstituted $C_2$-$C_{30}$ heteroaryl group.

In Formulae 1 to 3, $R_1$ to $R_{10}$ may be efficiently detached from the structures during a heat-treatment performed for forming the "carbon thin film" which will be described later.

$R_1$ to $R_{10}$ may be each independently selected from the group consisting of a hydrogen atom (H), a nitro group (—$NO_2$), a cyano group (—CN), a hydroxyl group (—OH), a carboxyl group (—COOH), a halogen atom, a substituted or unsubstituted $C_1$-$C_{30}$ alkyl group, a substituted or unsubstituted $C_1$-$C_{30}$ alkoxy group, a substituted or unsubstituted $C_6$-$C_{30}$ aryl group, a substituted or unsubstituted $C_6$-$C_{30}$ arylalkyl group, a substituted or unsubstituted $C_6$-$C_{30}$ aryloxy group, a substituted or unsubstituted $C_2$-$C_{30}$ heteroaryl group, a substituted or unsubstituted $C_2$-$C_{30}$ heteroarylalkyl group, a substituted or unsubstituted $C_2$-$C_{30}$ heteroaryloxy group, a substituted or unsubstituted $C_5$-$C_{20}$ cycloalkyl group, a substituted or unsubstituted $C_2$-$C_{30}$ heterocycloalkyl group, a substituted or unsubstituted $C_1$-$C_{30}$ alkylester group, a substituted or unsubstituted $C_6$-$C_{30}$ arylester group, a substituted or unsubstituted $C_2$-$C_{30}$ heteroarylester group, and —$N(Q_1)(Q_2)$, wherein $Q_1$ to $Q_2$ are each independently selected from the group consisting of a $C_1$-$C_{30}$ alkyl group, a $C_6$-$C_{30}$ aryl group, and a $C_2$-$C_{30}$ heteroaryl group.

For example, $R_1$ to $R_{15}$ may be each independently selected from the group consisting of a hydrogen atom (H), a nitro group (—$NO_2$), a cyano group (—CN), a hydroxyl group (—OH), a carboxyl group (—COOH), a halogen atom, a $C_1$-$C_{10}$ alkyl group, a $C_1$-$C_{10}$ alkoxy group, and —$N(Q_1)$ $(Q_2)$. In this regard, $Q_1$ to $Q_2$ may be each independently selected from the group consisting of a hydrogen atom and a $C_1$-$C_{10}$ alkyl group.

For example, $R_1$ to $R_{15}$ may be each independently selected from the group consisting of a hydrogen atom (H), a nitro group (—$NO_2$), a cyano group (—CN), a hydroxyl group (—OH), a carboxyl group (—COOH), a halogen atom, a methyl group, an ethyl group, a propyl group, a butyl group, a pentyl group, a hexyl group, a heptyl group, an octyl group, a methoxy group, an ethoxy group, a propoxy group, a butoxy group, a pentoxy group, and —$NH_2$, but are not limited thereto.

In Formula 3, if $A_1$ is a substituted $C_6$-$C_{30}$ aryl group or a substituted $C_2$-$C_{30}$ heteroaryl group, the substituent of the substituted $C_6$-$C_{30}$ aryl group or the substituted $C_2$-$C_{30}$ heteroaryl group may be selected from the group consisting of a nitro group (—$NO_2$), a cyano group (—CN), a hydroxyl group (—OH), a carboxyl group (—COOH), a halogen atom, a $C_1$-$C_{30}$ alkyl group, a $C_1$-$C_{30}$ alkoxy group, a $C_6$-$C_{30}$ aryl group, a $C_6$-$C_{30}$ arylalkyl group, a $C_6$-$C_{30}$ aryloxy group, a $C_2$-$C_{30}$ heteroaryl group, a $C_2$-$C_{30}$ heteroarylalkyl group, a $C_2$-$C_{30}$ heteroaryloxy group, a $C_5$-$C_{20}$ cycloalkyl group, a $C_2$-$C_{30}$ heterocycloalkyl group, a $C_1$-$C_{30}$ alkylester group, a $C_6$-$C_{30}$ arylester group, and a $C_2$-$C_{30}$ heteroarylester group, but is not limited thereto. For example, the substituent may be selected from the group consisting of a nitro group (—$NO_2$), a cyano group (—CN), a hydroxyl group (—OH), a carboxyl group (—COOH), a halogen atom, a $C_1$-$C_{10}$ alkyl group, and a $C_1$-$C_{10}$ alkoxy group, but is not limited thereto.

In Formulae 1 to 3, "*" indicates a binding site with an adjacent repeating unit.

For example, the polymer contained in the polymer layer 13 may include or consist of the repeating unit represented by Formula 1, wherein $Y_1$ is N.

Alternatively, the polymer contained in the polymer layer 13 may include or consist of the repeating unit represented by Formula 1, wherein $Y_1$ is N, and $R_1$ to $R_3$ may be each independently selected from the group consisting of a hydrogen atom (H), a nitro group (—$NO_2$), a cyano group (—CN), a hydroxyl group (—OH), a carboxyl group (—COOH), a halogen atom, a methyl group, an ethyl group, a propyl group, a butyl group, a pentyl group, a hexyl group, a heptyl group, an octyl group, a methoxy group, an ethoxy group, a propoxy group, a butoxy group, a pentoxy group, and —$NH_2$.

The polymer contained in the polymer layer 13 may also include or consist of the repeating unit represented by Formula 2, wherein $Y_2$ is O.

Alternatively, the polymer contained in the polymer layer 13 may include or consist of the repeating unit represented by Formula 2, wherein $Y_1$ is O; $R_7$ may be selected from the group consisting of a hydrogen atom (H), a $C_1$-$C_{10}$ alkyl group, and a $C_1$-$C_{10}$ alkoxy group (e.g., a methoxy group, an ethoxy group, a propoxy group, a butoxy group, and a pentoxy group); and $R_4$ to $R_6$ may be each independently selected from the group consisting of a hydrogen atom (H), a nitro group (—$NO_2$), a cyano group (—CN), a hydroxyl group (—OH), a carboxyl group (—COOH), a halogen atom, a methyl group, an ethyl group, a propyl group, a butyl group, a pentyl group, a hexyl group, a heptyl group, an octyl group, a methoxy group, an ethoxy group, a propoxy group, a butoxy group, a pentoxy group, and —$NH_2$.

The polymer contained in the polymer layer 13 may also include or consist of the repeating unit represented by Formula 3, wherein $A_1$ may be selected from the group consisting of a substituted or unsubstituted phenyl group, a substituted or unsubstituted pentalenyl group, a substituted or unsubstituted indenyl group, a substituted or unsubstituted naphthyl group, a substituted or unsubstituted azulenyl group, a substituted or unsubstituted heptalenyl group, a substituted or unsubstituted indacenyl group, a substituted or unsubstituted acenaphthyl group, a substituted or unsubstituted fluorenyl group, a substituted or unsubstituted phenalenyl group, a substituted or unsubstituted phenanthrenyl group, a substituted or unsubstituted anthracenyl group, a substituted or unsubstituted fluoranthenyl group, a substituted or unsubstituted triphenylenyl group, a substituted or unsubstituted pyrenylenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pyrrolyl group, a substituted or unsubstituted pyrazolyl group, a substituted or unsubstituted imidazolyl group, a substituted or unsubstituted imidazolinyl group, a substituted or unsubstituted imidazopyridinyl group, a substituted or unsubstituted imidazopyrimidinyl group, a substituted or unsubstituted pyridinyl group, a substituted or unsubstituted pyrazinyl group, a substituted or unsubstituted pyrimidinyl group, a substituted or unsubstituted indolyl group, a substituted or unsubstituted purinyl group, a substituted or unsubstituted quinolinyl group, a substituted or unsubstituted phthalazinyl group, a substituted or unsubstituted indolizinyl group, a substituted or unsubstituted naphthyridinyl group, a substituted or unsubstituted quinazolinyl group, a substituted or unsubstituted cinnolinyl group, a substituted or unsubstituted indazolyl group, a substituted or unsubstituted carbazolyl group, a substituted or unsubstituted phenazinyl group, a substituted or unsubstituted phenanthridinyl group, a substituted or unsubstituted pyranyl group, a substituted or unsubstituted chromenyl group, a substituted or unsubstituted benzofuranyl group, a substituted or unsubstituted thiophenyl group, a substituted or unsubstituted benzothiophenyl group, a substituted or unsubstituted isothiazolyl group, a substituted or unsubstituted benzoimidazolyl group, and a substituted or unsubstituted isoxazolyl group.

For example, $A_1$ may be a substituted or unsubstituted phenyl group, a substituted or unsubstituted naphthyl group, or a substituted or unsubstituted pyridinyl group, but is not limited thereto.

For example, the polymer contained in the polymer layer 13 may include at least one repeating unit selected from the group consisting of the repeating units represented by Formulae 11a to 13f:

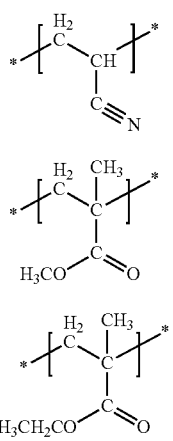

Formula 11a

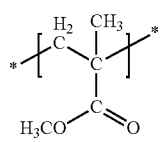

Formula 12a

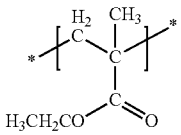

Formula 12b

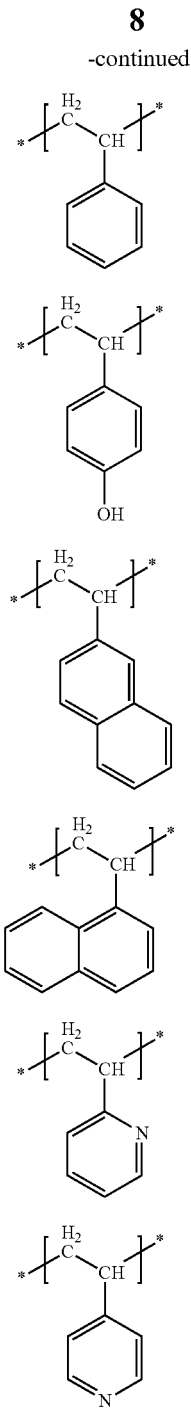

Formula 13a

Formula 13b

Formula 13c

Formula 13d

Formula 13e

Formula 13f

For example, the polymer contained in the polymer layer 13 may be a polymer consisting of the repeating unit represented by Formula 11a, a polymer consisting of the repeating unit represented by Formula 12a, a polymer consisting of the repeating unit represented by Formula 12b, a polymer consisting of the repeating unit represented by Formula 13a, a polymer consisting of the repeating unit represented by Formula 13b, a polymer consisting of the repeating unit represented by Formula 13c, a polymer consisting of the repeating unit represented by Formula 13d, a polymer consisting of the repeating unit represented by Formula 13e, or a polymer consisting of the repeating unit represented by Formula 13f, but is not limited thereto.

The polymer contained in the polymer layer 13 may be a polymer consisting of one of the repeating units represented by Formulae 1 to 3 or a copolymer including at least one of the repeating units represented by Formulae 1 to 3.

For example, the polymer contained in the polymer layer 13 may be a copolymer including at least one of the repeating unit represented by Formula 1, the repeating unit represented by Formula 2, the repeating unit represented by Formula 3, and further including a repeating unit selected from the group consisting of polyethylene (PE), polypropylene (PP), polybutene-1 (PB-1), poly 4-methyl-1-pentene, polyvinyl chloride (PVC), polyvinyl fluoride (PVF), polyvinyl amine (PVAm), polystyrene (PS), poly4-vinylphenol (PVP), poly (2-vinylnaphthalene), poly(1-vinylnaphthalene), poly 2-vinyl pyridine, poly 4-vinyl pyridine, polyisobutylene, polyvinylidene fluoride, polyvinylidene chloride, and polyacrylic acid. Alternatively, the polymer contained in the polymer layer 13 may be a copolymer of at least one of the repeating unit represented by Formula 1 and the repeating unit represented by Formula 2 and itaconic acid and may have a variety of modifications.

For example, the polymer contained in the polymer layer 13 may be polystyrene, polyacrylonitrile (PAN), polymethyl methacrylate, polyethyl methacrylate, or polyvinyl alcohol, but is not limited thereto.

A weight average molecular weight (Mw) of the polymer contained in the polymer layer 13 may be in the range of 1,000 to 10,000,000, for example 10,000 to 1,000,000. If the weight average molecular weight (Mw) of the polymer contained in the polymer layer 13 is within the range described above, a first mixture that will be described below may have fluidity and/or viscosity suitable for a coating process, and a carbon thin film having excellent conductivity may be obtained.

Step 1A includes providing a first mixture including the polymer and a solvent or a second mixture including a precursor of the polymer and a solvent to the substrate 11 by using a coating process. In this regard, if the second mixture is used, the precursor is polymerized during a soft baking process and heat-treatment which will be described below, resulting in forming the polymer as described above.

The first mixture and the second mixture may further include at least one additive selected from the group consisting of a cross-linking agent, an acid catalyst, a metal filler, a ceramic filler, and nanoparticles.

The coating process may be spin-coating, inkjet printing, nozzle printing, dip coating, electrophoretic deposition, tape casting, screen printing, doctor blade coating, gravure printing, gravure offset printing, Langmuir-Blodgett (LB) technique, or layer-by-layer self-assembly, but is not limited thereto. For example, the coating process may be spin-coating.

Because the amount of the polymer contained in a unit volume of the polymer layer 13 is controlled by regulating the concentrations of the first mixture and/or the second mixture, the thickness of the polymer layer 13 may be controlled, so that the thickness of the carbon thin film 17 may also be controlled. According to the method of preparing a carbon thin film, the thickness of the carbon thin film may be controlled.

After providing the first mixture and/or the second mixture to the substrate 11, a soft baking may optionally be performed in order to remove the solvent contained in the first mixture and/or the second mixture.

The temperature range and time period for the soft baking may be controlled according to the polymer, the solvent, concentrations of the first mixture, and/or the second mixture.

The thickness of the polymer layer 13 may be controlled by regulating the concentrations of the first mixture and the second mixture and may be in the range of 2 nm to 50 μm, for example, 2 nm to 1000 nm. If the thickness of the polymer layer 13 is within the range described above, a carbon thin film having a thickness greater than that of a graphene monolayer may be prepared, and the polymer layer 13 may have uniform quality.

For example, if the thickness of the polymer layer 13 is in the range of 2 nm to 50 μm, the prepared carbon thin film 17 may have a thickness in the range of 0.34 nm, which is similar to a thickness of a graphene monolayer, to 50 nm. Due to excellent transmittance of visible light, the prepared carbon thin film 17 may be used as a transparent electrode of a variety of displays. For example, the prepared carbon thin film 17 may be used as a wiring electrode by increasing the thickness of the polymer layer 13 to about 50 μm or greater.

Then, Step 1B by which a protective layer 15 is formed on the polymer layer 13 is performed.

The protective layer 15 prevents the polymer contained in the polymer layer 13 from being lost by degradation and/or calcination during the heat-treatment. Thus, by forming the protective layer 15, the carbon thin film 17 may have excellent conductivity due to a plurality of domains having a graphene structure in which 6-membered carbon rings are fused with each other.

The protective layer 15 may include a material having a melting point of 800° C. or higher. For example, the protective layer 15 may include at least one selected from the group consisting of metal, a metal oxide, ceramic, a semiconductor oxide, and a semiconductor nitride. For example, the protective layer 15 may include at least one selected from the group consisting of copper (Cu), nickel (Ni), palladium (Pd), gold (Au), silver (Ag), aluminum (Al), molybdenum (Mo), a copper oxide, a nickel oxide, a palladium oxide, an aluminum oxide, a molybdenum oxide, gallium nitride (GaN), silicon nitride (SiN), silicon oxide ($SiO_2$), and a combination of at least two of the foregoing.

The thickness of the protective layer 15 may be in the range of 2 nm to 2000 nm, for example, 10 nm to 600 nm. If the thickness of the protective layer 15 is within the range described above, a uniform layer may be formed.

The protective layer 15 may be formed by using any known method used to form a metal layer and/or a metal oxide layer, e.g., deposition.

Then, Step 1C, as a heat-treatment, is performed to carbonize the polymer layer 13, resulting in preparing the carbon thin film 17. The heat-treatment may be performed under conditions where the polymers contained in the polymer layer 13 are carbonized.

For this, the heat-treatment may be performed in an inert atmosphere, for example, in a nitrogen, argon, and/or hydrogen atmosphere, or in a vacuum atmosphere. In addition, hydrogen gas, methane gas, $CF_4$ gas, or the like may optionally be injected thereinto during the heat-treatment as impurity gas to modify a work function of the carbon thin film 17 by facilitating carbonization or inducing defects in the carbon thin film 17.

In addition, the heat-treatment may be performed at a temperature in the range of a thermal decomposition temperature of the polymer contained in the polymer layer 13 to 2500° C., for example, 600° C. to 1500° C., for 30 seconds to 5 days, for example 1 minute to 20 hours. The atmosphere, temperature range, and time period of the heat-treatment may vary according to the structure and content of the polymer contained in the polymer layer 13.

By the heat-treatment (i.e., "Step 1C" of FIG. 1), the polymer of the polymer layer 13 is carbonized, resulting in forming the carbon thin film 17. In this regard, the polymers consecutively bind to each other to form domains having a graphene-like structure.

While the carbon thin film 17 is formed, the protective layer 15 may be removed by increasing the temperature of the heat-treatment Step 1C to greater than melting points of materials contained in the protective layer 15.

Alternatively, if the conditions of the heat-treatment Step 1C are not sufficient for removing the protective layer 15, the protective layer 15 may partially remain on the carbon thin film 17 although not shown in FIG. 1. Thus, the method of preparing a carbon thin film may further include removing the protective layer 15 remaining on the carbon thin film 17. The protective layer 15 remaining on the carbon thin film 17 may be removed using any known method used to remove a metal layer and/or a metal oxide layer. For example, the protective layer 15 remaining on the carbon thin film 17 may be removed by washing the surface of the carbon thin film 17 with an etchant for a metal or a metal oxide. For example, if the protective layer 15 is formed of Ni, it may be removed using $FeCl_3$ (generally, 1 M in distilled water) or a marble reagent (generally, 50 ml of HCl:50 ml of distilled water:10 g of $CuSO_4$ solution).

Because the method of preparing a carbon thin film is based on the coating process and heat-treating process, a cost-effective, stable, large-area, and two-dimensional carbon thin film 17 may be obtained according to the method of preparing a carbon thin film.

In addition, because the thickness of the carbon thin film 17 may be efficiently controlled by regulating the concentrations of the first mixture and/or the second mixture, the carbon thin film 17 may have various sizes.

The carbon thin film 17 may be patterned by patterning the protective layer 15 and the polymer layer 13 before performing Step 1C, or patterning the carbon thin film 17 after performing Step 1C and before separating the carbon thin film 17 from the substrate 11. Because a variety of device assemblies may directly be disposed on the patterned carbon thin film 17, the carbon thin film 17 may be efficiently applied to electrodes or wirings having various patterns.

The patterning process may be performing using at least one method selected from the group consisting of photolithography, soft lithography, e-beam lithography, nanoimprint lithography, mold-assisted lithography, step and flash imprint lithography, dip pen lithography, microcontact printing, and inkjet printing. A patterning using a photoresist and a mask and/or a patterning using oxygen plasma may be used after performing Step 1D (i.e., second heat-treatment).

The carbon thin film 17 may be a graphite sheet, a graphene sheet (or film), a-few-layer graphene, and an amorphous carbon film. The graphene sheet may be a graphene monolayer having a thickness of 0.34 nm, a few-layer graphene in which 2 to 10 graphene monolayers are stacked, or a multilayer graphene in which more than 10 graphene monolayers are stacked. For example, the carbon thin film 17 may be a graphene sheet. According to an embodiment, the carbon thin film 17 may be a few-layer graphene, but is not limited thereto. The carbon thin film 17 may have 50% or higher transmittance of visible light. The carbon thin film 17 may have excellent conductivity. For example, the carbon thin film 17 may have a conductivity of 10 S/cm or greater.

Figure 2:
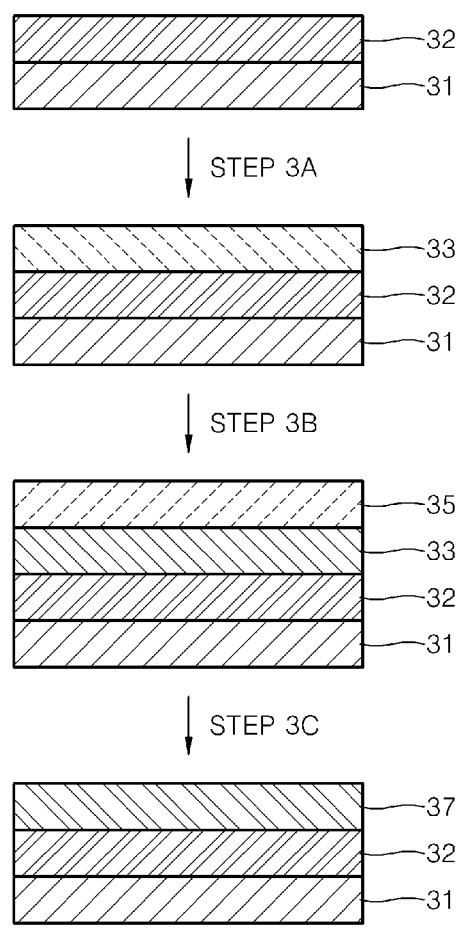
FIG. 2 is a diagram for describing a method of preparing a carbon thin film, according to another embodiment.

FIG. 2 is a diagram for describing a method of preparing a carbon thin film, according to another embodiment. The method described with reference to FIG. 2 is identical to the method of preparing a carbon thin film described with reference to FIG. 1, except that a catalyst layer 32 is formed on a substrate 31, and then a polymer layer 33 is formed on the catalyst layer 32. Referring to FIG. 2, after the catalyst layer 32 is formed on the substrate 31, the polymer layer 33 is formed on the catalyst layer 32 (Step 3A), and a protective layer 35 is formed on the polymer layer 33 (Step 3B), and then a carbon thin film 37 is formed by heat-treating (Step 3C). For descriptions of the substrate 31, the polymer layer 33, the protective layer 35, the carbon thin film 37, Step 3A, Step 3B, and Step 3C shown in FIG. 2, refer to the substrate 11, the polymer layer 13, the protective layer 15, the carbon thin film 17, Step 1A, Step 1B, and Step 1C shown in FIG. 1.

The catalyst layer 32 may act as a catalyst for forming a graphene structure while the carbon thin film 37 is formed so as to increase domains of the graphene-like structure of the carbon thin film 37.

The catalyst layer 32 may include nickel (Ni), cobalt (Co), iron (Fe), gold (Au), aluminum (Al), chromium (Cr), copper (Cu), magnesium (Mg), molybdenum (Mo), rhodium (Rh), silicon (Si), tantalum (Ta), titanium (Ti), tungsten (W), uranium (U), vanadium (V), zirconium (Zr), and a combination of at least two of the foregoing.

The thickness of the catalyst layer 32 may be in the range of 10 nm to 1000 nm, for example, 200 nm to 600 nm.

The catalyst layer 32 may remain after heat-treating (Step 3) to form the carbon thin film 37. The method may further include removing the catalyst layer 32 to separate the carbon thin film 37 from the substrate 31.

Meanwhile, the method may further include stabilizing the polymer layer 33 by pre-heat-treating the polymer layer 33 before forming the protective layer 35. By the pre-heat-treatment, at least one portion of the polymers contained in the polymer layers 13 and 33 may be converted into "stabilized polymer".

The pre-heat-treatment may be performed under conditions where at least one of intramolecular addition reaction and intramolecular double bond formation reaction occurs in the polymers contained in the polymer layers 13 and 33.

The conditions for the pre-heat-treatment may vary according to the structure, orientation, and the contents of the polymers contained in the polymer layers 13 and 33, but the pre-heat-treatment may be performed, for example, at a temperature of 200° C. to 350° C. (e.g., 250° C. to 300° C.) and for 1 minute to 24 hours (e.g., 1 minute to 15 hours).

As a result of the pre-heat-treatment, the stabilized polymer contained in the polymer layers 13 and 33 includes a plurality of saturated or unsaturated 6-membered rings, wherein the saturated or unsaturated 6-membered rings may be fused with each other.

For example, if the polymers contained in the polymer layers 13 and 33 include the repeating unit represented by Formula 1, the stabilized polymers may include at least one selected from the group consisting of a repeating unit represented by Formula 1a below and a repeating unit represented by Formula 1b below.

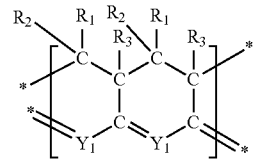

Formula 1a

-continued

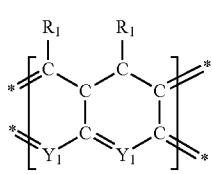

Formula 1b

In Formulae 1a and 1b, $Y_1$, $R_1$ to $R_3$, and * are as described above with reference to Formula 1.

Alternatively, if the polymers contained in the polymer layers 13 and 33 include the repeating unit represented by Formula 2, the stabilized polymers may include at least one selected from the group consisting of a repeating unit represented by Formula 2a below, a repeating unit represented by Formula 2b below, and a repeating unit represented by Formula 2c below.

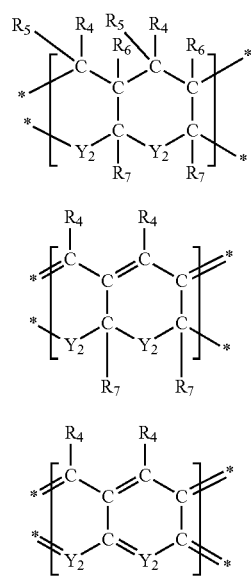

Formula 2a

Formula 2b

Formula 2c

In Formulae 2a to 2c, $Y_2$, $R_4$ to $R_7$, and * are as described above with reference to Formula 2.

If the polymers contained in the polymer layers 13 and 33 include the repeating unit represented by Formula 3, a double bond contained in a ring represented by $A_1$ of Formula 3 may contribute to the formation of the stabilized polymers in a similar manner as a —C=$Y_2$— bond of Formula 2, but the present invention is not limited thereto.

For example, if the polymers contained in the polymer layers 13 and 33 are polyacrylonitrile (PAN) represented by Formula 4 below, an intramolecular addition reaction occurs between N of a cyano group of the polyacrylonitrile and C of an adjacent cyano group to form a single bond by the pre-heat-treatment as described above, resulting in producing a first stabilized polyacrylonitrile represented by Formula 4a below. In the first stabilized polyacrylonitrile, an intermolecular double bond formation reaction occurs based on dehydrogenation, resulting in producing a second stabilized polyacrylonitrile represented by Formula 4b below.

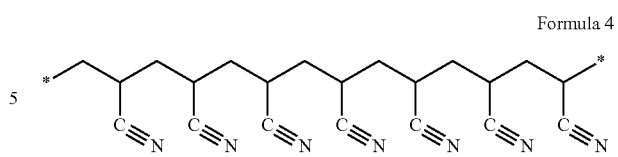

Formula 4

Formula 4a

Formula 4b

Thus, if the polymers contained in the polymer layers 13 and 33 are polyacrylonitrile (PAN) represented by Formula 4, the stabilized polymer prepared by the pre-heat-treatment may include only the second stabilized polymer represented by Formula 4b or both of the first stabilized polymer represented by Formula 4a and the second stabilized polymer represented by Formula 4b. This may be controlled by conditions for the pre-heat-treatment.

As such, at least one portion of the polymer contained in the polymer layers 13 and 33 may be converted into stabilized polymers having a ladder structure with heat resistance by the pre-heat-treatment. Thus, even though the stabilized polymers are exposed to the heat-treatment for forming the carbon thin films 17 and 37 (Steps 1C and 3C of FIGS. 1 and 2), the degradation of the polymers may be minimized. Thus, carbon thin films 17 and 37 may have excellent conductivity due to a plurality of domains having a graphene structure in which 6-membered carbon rings are fused with each other.

For example, during the heat-treatment for forming the carbon thin films 17 and 37, two of the second stabilized polyacrylonitrile (Formula 4b) bind to each other to form a structure represented by Formula 4c below.

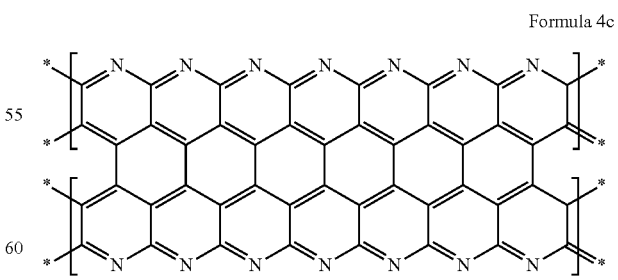

Formula 4c

As carbonization is performed while such bindings are consecutively performed, the carbon thin films 17 and 37 including a plurality of first layers having the structure as shown in Formula 4d may be obtained.

Formula 4d

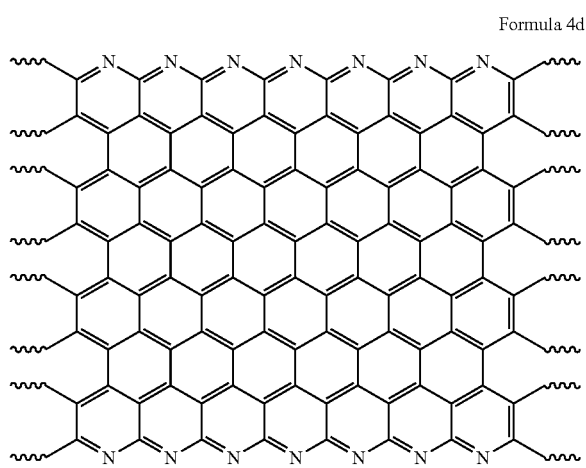

In the carbon thin films 17 and 37, the plurality of first layers may be stacked in a second direction perpendicular to a first direction in which the first layers extend, but the present invention is not limited thereto.

As described above, in the method of preparing a carbon thin film, the catalyst layer 32 and/or the protective layers 15 and 35 may remain after forming the carbon thin films 17 and 37 and may be removed using an etchant. The carbon thin films 17 and 37 may directly be used on the substrates 11 and 31 on which the carbon thin films 17 and 37 are formed. For example, the carbon thin films 17 and 37 formed on the substrates 11 and 31 are directly patterned to form carbon thin film electrode patterns on the substrates 11 and 31. Alternatively, the carbon thin films 17 and 37 are separated from the substrates 11 and 31 on which the carbon thin films 17 and 37 are formed and transferred to another substrate such as a plastic substrate to prepare a flexible device. The transferring process may be performed by separating the carbon thin films 17 and 37 from the substrates 11 and 31 by contacting the carbon thin films 17 and 37 formed on the substrates 11 and 31 with an adhesive layer, such as polymethyl methacrylate (PMMA), polydimethylsiloxane (PDMS), and a thermal release tape, and contacting the carbon tin films 17 and 37 in contact with the adhesive layer with another substrate. The carbon thin films 17 and 37 transferred to another substrate may be patterned by using a reactive ion etching or a gas (e.g., $O_2$) plasma process.

The carbon thin films 17 and 37 may be applied to a variety of conductive layers. For example, the carbon thin films 17 and 37 may be applied to electrodes, wirings, and channel layers of various electronics and electrochemical devices. The electronics may be inorganic light emitting diodes, organic light emitting diodes (OLEDs), inorganic solar cells, organic photovoltaic cells (OPVs), or inorganic thin film transistors, memories, electrochemical/bio sensors, RF devices, rectifiers, complementary metal oxide semiconductor (CMOS) devices, or organic thin film transistors (OTFT), and the electrochemical devices may be lithium batteries or fuel cells, but they are not limited thereto.

Figure 3:
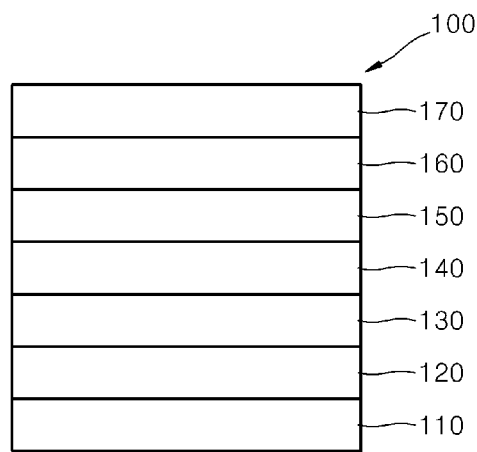
FIG. 3 is a schematic cross-sectional view of an organic light-emitting diode including the carbon thin film.

FIG. 3 is a schematic cross-sectional view of an organic light-emitting diode 100 including the carbon thin film. The organic light-emitting diode 100 of FIG. 3 includes a first electrode 110, a hole injection layer (HIL) 120, a hole transport layer (HTL) 130, an emission layer (EML) 140, an electron transport layer (ETL) 150, an electron injection layer (EIL) 160, and a second electrode 170. When a voltage is applied to the first electrode 110 and the second electrode 170 of the organic light-emitting diode 100, holes injected from the first electrode 110 move to the EML 140 via the HIL 120 and the HTL 130, and electrons injected from the second electrode 170 move to the EML 140 via the ETL 150 and the EIL 160. The holes and electrons recombine in the EML 140 to generate excitons. When the excitons drop from an excited state to a ground state, light is emitted.

The first electrode 110 may be the carbon thin film as described above.

The HIL 120 may be formed by using any known method selected from the group consisting of vacuum deposition, spin-coating, casting, LB technique, or the like. When the HIL 120 is formed by using vacuum deposition, deposition conditions may vary according to a compound that is used to form the HIL 120, and the structure and thermal properties of the HIL 120 to be formed. For example, conditions for vacuum deposition may include a deposition temperature ranging from 100 to 500° C., a pressure ranging from $10^{-10}$ to $10^{-3}$ torr, and a deposition velocity ranging from 0.01 to 100 Å/sec. When the HIL 120 is formed by using spin-coating, coating conditions may vary according to a compound that is used to form the HIL 120, and the structure and thermal properties of the HIL 120 to be formed. For example, however, conditions for the spin-coating may include the coating speed ranging from 2000 to 5000 rpm, and a heat-treatment temperature for removing a solvent after coating ranging from 80 to 200° C.

A material used to form the HIL 120 may be any known hole injecting material. Examples of the material include a phthalocyanine compound such as copper phthalocyanine, m-MTDATA represented by the following formula, TDATA represented by the following formula, 2T-NATA represented by the following formula, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid (Pani/CSA), and (polyaniline)/poly(4-styrenesulfonate) (PANI/PSS), but are not limited thereto.

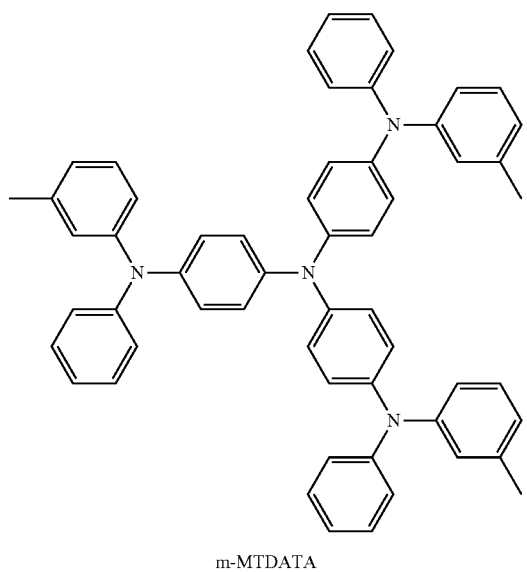

m-MTDATA

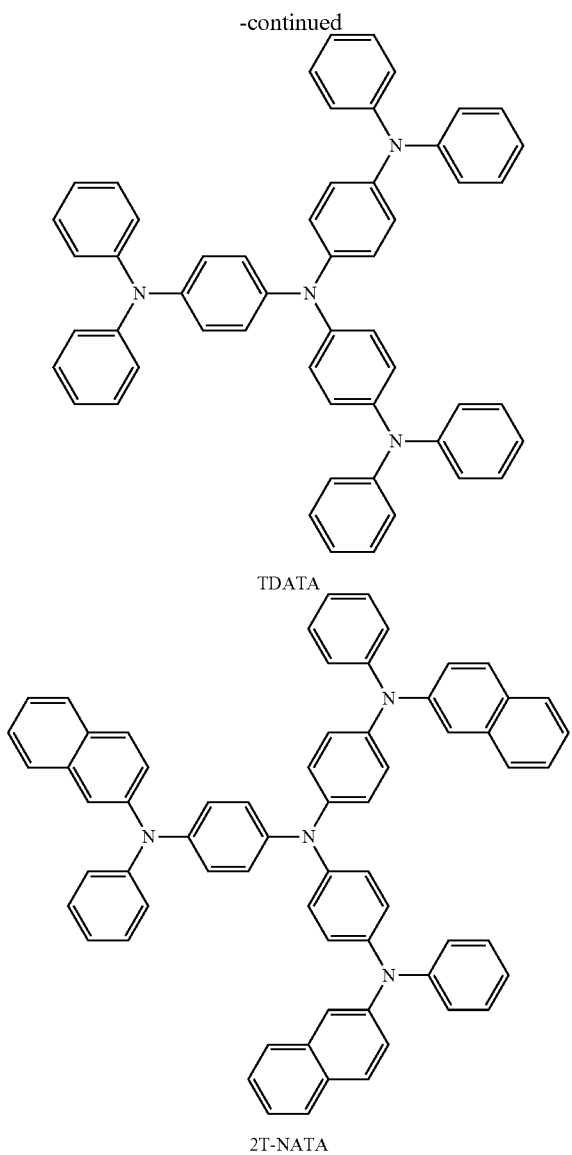

TDATA

2T-NATA

The thickness of the HIL 120 may be in the range of about 10 to about 10000 Å, for example, about 100 to about 1000 Å. When the thickness of the HIL 120 is within the range described above, the HIL 120 may have excellent hole injecting properties without an increase in driving voltage.

The HTL 130 may be formed by using any known method selected from the group consisting of vacuum deposition, spin-coating, casting, LB technique, or the like. In this regard, the deposition and coating conditions may be similar to those for the formation of the HIL 120, although the deposition and coating conditions may vary according to a compound that is used to form the HTL 130, and the structure and thermal properties of the HTL 130 to be formed.

A material used to form the HTL 130 may be any known hole transporting material. Examples of the material include an amine derivative having an aromatic condensation ring such as N,N'-di(1-naphthyl)-N,N'-diphenylbenzidine (NPB), N-phenylcarbazole, and N,N'-bis(3-methylphenyl)-N,N'-diphenyl-[1,1-biphenyl]-4,4'-diamine (TPD), and a triphenylamine-based material such as 4,4',4"-tris(N-carbazolyl) triphenylamine (TCTA). Among these materials, TCTA may not only transport holes but also inhibit excitons from being diffused from the EML 140.

The thickness of the HTL 130 may be in the range of about 50 to about 1,000 Å, for example, about 100 to about 600 Å. When the thickness of the HTL 130 is within this range, the HTL 130 may have excellent hole transporting properties without an increase in driving voltage.

The EML 140 may be formed by using any known method selected from the group consisting of vacuum deposition, spin-coating, casting, LB technique, or the like. In this regard, the deposition and coating conditions may be similar to those for the formation of the HIL 120, although the deposition and coating conditions may vary according to a compound that is used to form the EML 140, and the structure and thermal properties of the EML 140 to be formed.

The EML 140 may be formed of an emitting material or may include a host and a dopant.

Examples of the host include $Alq_3$, 4,4'-N,N'-dicarbazole-biphenyl (CBP), 9,10-di(naphthalene-2-yl)anthracene (ADN), TCTA, 1,3,5-tris(N-phenylbenzimidazole-2-yl)benzene (TPBI), 3-tert-butyl-9,10-di(naphtha-2-yl)anthracene (TBADN), E3 (refer to the following formula), and $BeBq_2$ (refer to the following formula), but are not limited thereto.

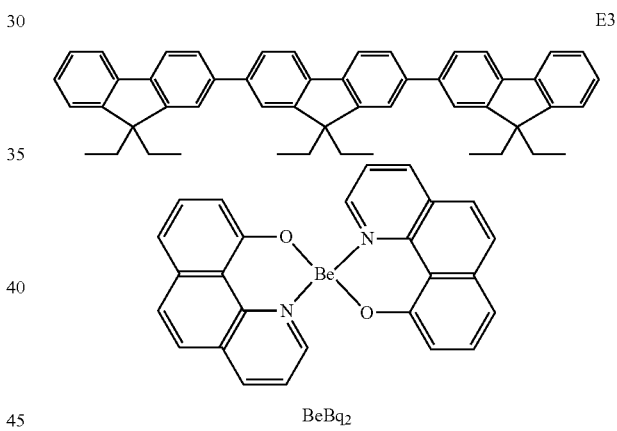

E3

$BeBq_2$

Examples of known red dopants include PtOEP, $Ir(piq)_3$, and $Btp_2Ir(acac)$, but are not limited thereto.

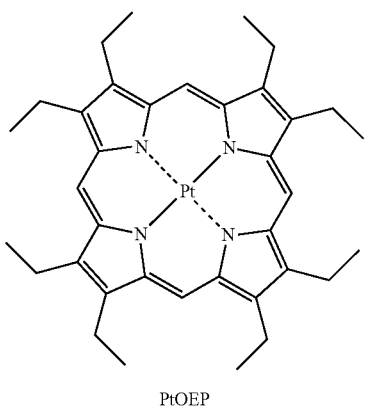

PtOEP

-continued

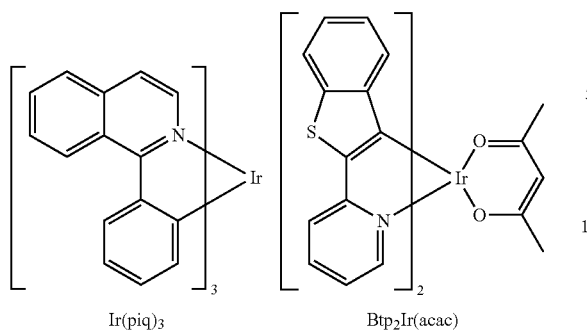

Ir(piq)₃   Btp₂Ir(acac)

Examples of known green dopants include Ir(ppy)₃ (where "ppy" denotes phenylpyridine), Ir(ppy)₂(acac), Ir(mpyp)₃, and C545T, but are not limited thereto.

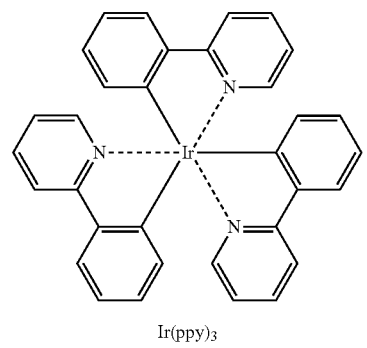

Ir(ppy)₃

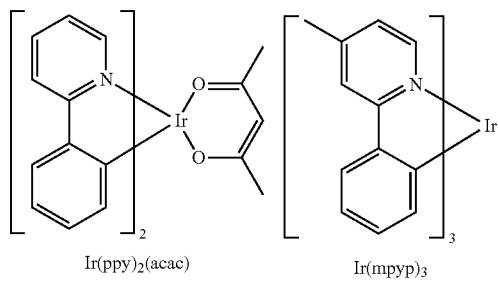

Ir(ppy)₂(acac)   Ir(mpyp)₃

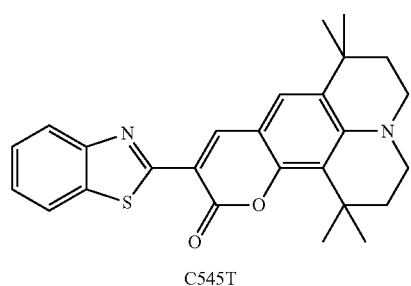

C545T

Examples of known blue dopants include F₂Irpic, (F₂ppy)₂Ir(tmd), Ir(dfppz)₃, terfluorene, 4,4'-bis(4-di-p-tolylaminostyryl)biphenyl (DPAVBi), and 2,5,8,11-tetra-t-butyl pherylene (TBP), but are not limited thereto.

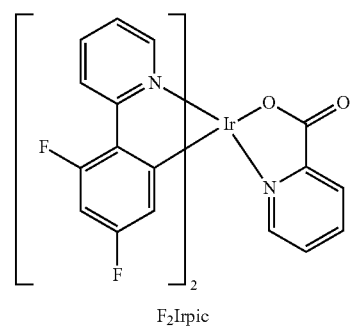

F₂Irpic

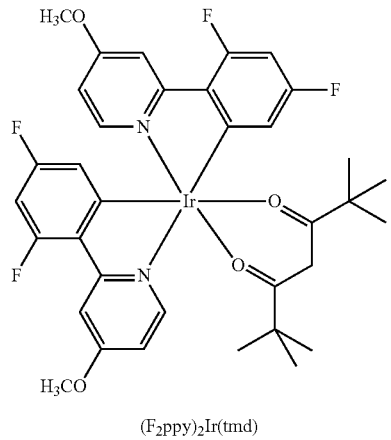

(F₂ppy)₂Ir(tmd)

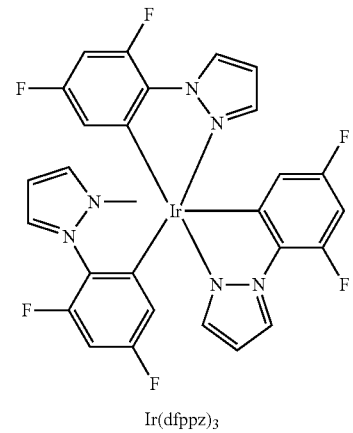

Ir(dfppz)₃

The thickness of the EML 140 may be in the range of about 100 to about 1,000 Å, for example, about 100 to about 600 Å. When the thickness of the EML 140 is within the range described above, the EML 140 may have excellent light-emitting characteristics without an increase in driving voltage.

A hole blocking layer (HBL) (not shown in FIG. 3) prevents diffusion of triplet excitons or holes of the EML 140 (if, the EML 140 includes a phosphorescent compound) into a second electrode. The HBL may be formed on the EML 140 by using any known method such as vacuum deposition, spin-coating, casting, and LB technique. In this regard, the deposition and coating conditions may be similar to those for the formation of the HIL 120, although the deposition and coating conditions may vary according to a compound that is used to form the HBL, and the structure and thermal properties of the HBL to be formed.

A material used to form the HBL may be any known hole blocking material. For example, oxadiazole derivatives, triazole derivatives, and phenanthroline derivatives may be used to form the HBL.

The thickness of the HBL may be in a range of about 50 to about 1,000 Å, for example, about 100 to about 300 Å. When the thickness of the HBL is within the range described above, the HBL may have excellent hole blocking properties without an increase in driving voltage.

The ETL 150 may be formed by using any known method selected from the group consisting of vacuum deposition, spin-coating, casting, LB technique, or the like. In this regard, the deposition and coating conditions may be similar to those for the formation of the HIL 120, although the deposition and coating conditions may vary according to a compound that is used to form the ETL 150, and the structure and thermal properties of the ETL 150 to be formed.

A material used to form the ETL 150 may be any known electron transporting material, for example, tris(8-quinolinorate)aluminum (Alq$_3$), TAZ, 4,7-diphenyl-1,10-phenanthroline (Bphen), BCP, BeBq$_2$, and BAlq.

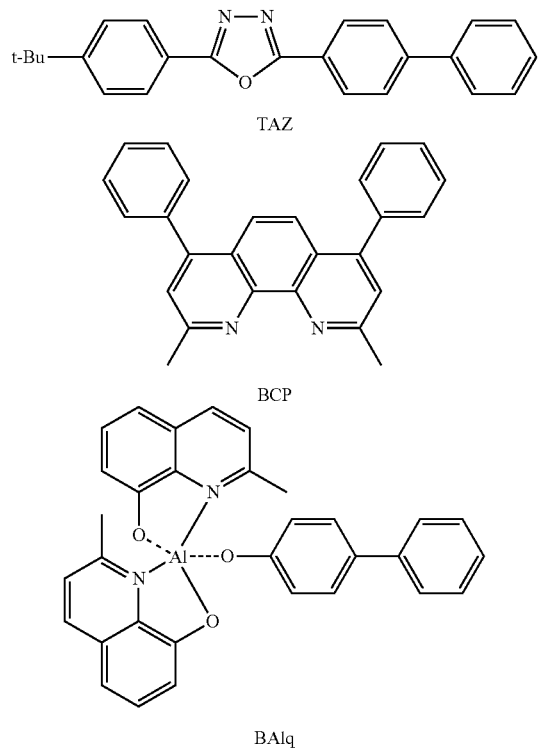

The thickness of the ETL 150 may be in the range of about 100 to about 1,000 Å, for example, about 200 to about 500 Å. When the thickness of the ETL 150 is within the range described above, the ETL 150 may have excellent electron transporting properties without an increase in driving voltage.

The EIL 160 may be formed on the ETL 150. A material used to form the EIL 160 may be any known electron injecting material such as LiF, NaCl, CsF, Li$_2$O, BaO, and BaF$_2$. The deposition conditions may be similar to those for the formation of the HIL 120, although the deposition conditions may vary according to a compound that is used to form the EIL 160.

The thickness of the EIL 160 may be in the range of about 1 to about 100 Å, for example, about 5 to about 50 Å. When the thickness of the EIL 160 is within the range described above, the EIL 160 may have satisfactory electron injecting properties without an increase in driving voltage.

The second electrode 170 may be a cathode, which is an electron injecting electrode. A low work function material such as metal, an alloy, an electrically conductive compound, or any combination thereof may be used to form the second electrode 170. For example, the second electrode 170 may be formed of lithium (Li), magnesium (Mg), aluminum (Al), aluminum (Al-lithium (Li), calcium (Ca), magnesium (Mg)-indium (In), magnesium (Mg)-silver (Ag), or the like. ITO, IZO, or the like may also be used to prepare a top-emission type light-emitting diode.

For example, the organic light-emitting diode 100 including the carbon thin film may have a first electrode (carbon thin film)/HIL (PEDOT, 50 nm)/HTL (NPB, 20 nm)/EML (BeBq2:C545T, 30 nm)/ETL (BeBq2, 20 nm)/EIL (LiF, 1 nm)/second electrode (Al, 150 nm) structure, but is not limited thereto.

Because the first electrode 110 of the organic light-emitting diode 100 may be prepared by using the method of preparing a carbon thin film as described above, the first electrode 110 has excellent electrical properties and may be prepared in a cost-effective manner.

Figure 4:
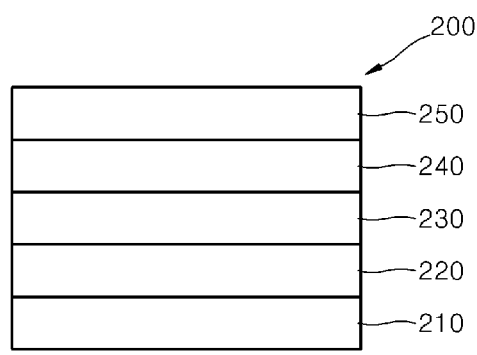
FIG. 4 is a schematic cross-sectional view of an organic photovoltaic cell including the carbon thin film.

FIG. 4 is a schematic cross-sectional view of an organic photovoltaic cell 200 including the carbon thin film.

The organic photovoltaic cell 200 of FIG. 4 includes a first electrode 210, a hole collecting buffer layer 220, a hetero-junction layer 230, an electron accepting (or collecting) layer 240, and a second electrode 250. Light that arrives at the organic photovoltaic cell 200 splits into holes and electrons in the hetero-junction layer 230. The electrons move to the second electrode 250 via the electron accepting layer 240, and the holes move to the first electrode 210 via the hole collecting buffer layer 220.

The first electrode 210 may be the carbon thin film as described above.

The hole collecting buffer layer 220 may include a material capable of accepting holes, for example, the materials used to form the HIL 120 and the HTL 130 of the organic light-emitting diode 100 as described above.

The hetero-junction layer 230 may include a material capable of splitting light into holes and electrons. For example, the hetero-junction layer 230 may include a p-type organic semiconductor material or an n-type organic semiconductor material. For example, the hetero-junction layer 230 may include poly(3-hexylthiophene) and phenyl-C61-butyric acid methyl ester (PCMB), but is not limited thereto.

The electron accepting layer 240 may include a material capable of accepting electrons, for example, the material used to form the EIL 160 of the organic light-emitting diode 100 as described above.

The second electrode 250 may be a cathode, which is an electron injecting electrode. A low work function material such as metal, an alloy, an electrically conductive compound, or any combination thereof may be used to form the second electrode 250. In this regard, the second electrode 250 may be formed of lithium (Li), magnesium (Mg), aluminum (Al), aluminum (Al-lithium (Li), calcium (Ca), magnesium (Mg)-indium (In), magnesium (Mg)-silver (Ag), or the like.

For example, the organic photovoltaic cell 200 including the carbon thin film may have a first electrode (carbon thin film)/buffer layer (PEDOT, 35 nm)/hetero-junction layer (P$_3$HT:PCBM, 210 nm)/electron accepting layer (BaF$_2$, 1 nm)/second electrode (Al, 100 nm) structure, but is not limited thereto.

Figure 5:
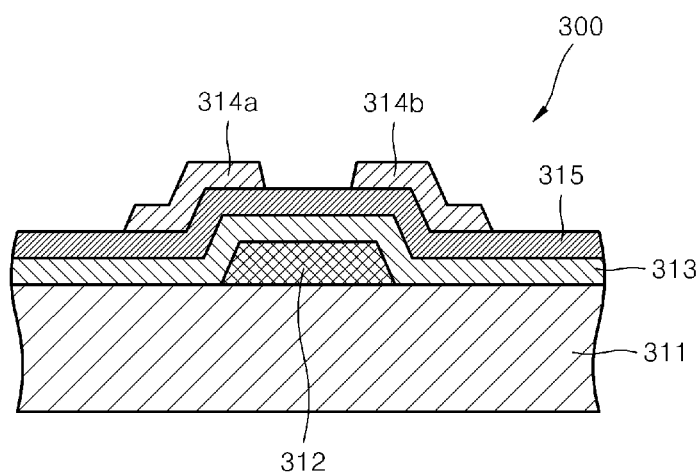
FIG. 5 is a schematic cross-sectional view of an organic thin film transistor including the carbon thin film.

FIG. 5 is a schematic cross-sectional view of an organic thin film transistor 300 including the carbon thin film.

The organic thin film transistor 300 of FIG. 5 includes a substrate 311, a gate electrode 312, an insulating layer 313, an organic semiconductor layer 315, and source and drain electrodes 314a and 314b. At least one of the gate electrode 312, the organic semiconductor layer 315, and the source and drain electrodes 314a and 314b may be the carbon thin film as described above.

The substrate 311 may be any substrate that is commonly used in electronics, and may be a glass substrate or a transparent plastic substrate with excellent transparency, surface smoothness, ease of handling, and water resistance.

The gate electrode 312 may be formed on the substrate 311 with a predetermined pattern. The gate electrode 312 may be formed of a metal such as gold (Au), silver (Ag), copper (Cu), nickel (Ni), platinum (Pt), palladium (Pd), aluminum (Al), and molybdenum (Mo), or a metal alloy such as Al:Nd and Mo:W, but is not limited thereto. The gate electrode 312 may also be the carbon thin film as described above.

The insulating layer 313 is formed on the gate electrode 312 to cover the gate electrode 312. The insulating layer 313 may include an inorganic material such as a metal oxide or metal nitride, an organic material such as an insulating organic polymer, or various other materials.

The organic semiconductor layer 315 is formed on the insulating layer 313. The organic semiconductor layer 315 may be the carbon thin film as described above. Alternatively, the organic semiconductor layer 315 may include pentacene, tetracene, anthracene, naphthalene, α-6-thiophene, α-4-thiophene, perylene and derivatives thereof, rubrene and derivatives thereof, coronene and derivatives thereof, perylene tetracarboxylic diimide and derivatives thereof, perylene tetracarboxylic dianhydride and derivatives thereof, polythiophene and derivatives thereof, poly(p-phenylene vinylene) and derivatives thereof, poly(p-phenylene) and derivatives thereof, polyfluorene and derivatives thereof, polythiophenevinylene and derivatives thereof, polythiophene-hetero ring aromatic copolymer and derivatives thereof, oligoacene of naphthalene and derivatives thereof, oligothiophene of α-5-thiophene and derivatives thereof, phthalocyanine containing or not containing a metal and derivatives thereof, pyromellitic dianhydride and derivatives thereof, or pyromellitic diimide and derivatives thereof, but is not limited thereto.

Figure 6:
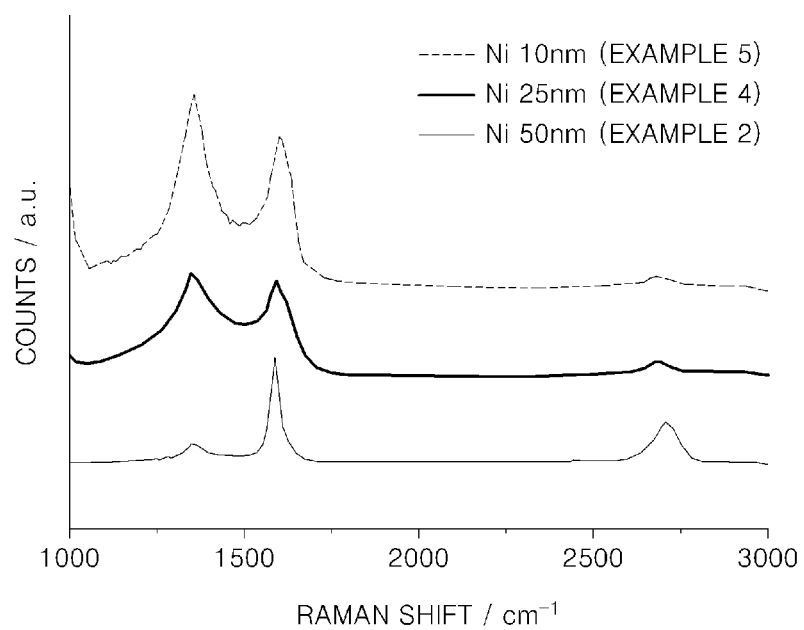
FIG. 6 is a graph illustrating Raman spectra of carbon thin films prepared in Examples 2, 4 and 5.

The source and drain electrodes 314a and 314b are respectively formed on the organic semiconductor layer 315. The source and drain electrodes 314a and 314b may overlap with a portion of the gate electrode 312 as shown in FIG. 6, but are not limited thereto. The source and drain electrodes 314a and 314b may be the carbon thin film as described above. Alternatively, the source and drain electrodes 314a and 314b may include a noble metal having a work function of 5.0 eV or more, for example, gold (Au), palladium (Pd), platinum (Pt), nickel (Ni), rhodium (Rh), ruthenium (Ru), iridium (Ir), osmium (Os), or a combination of at least two of the foregoing in consideration of a work function of the material used to form the organic semiconductor layer 315.

For example, the organic thin film transistor 300 may have a substrate/gate electrode/insulating layer/organic semiconductor layer (carbon thin film)/source and drain electrodes (Au, thicker than 10 nm) structure. The organic thin film transistor 300 may also have a substrate/gate electrode/insulating layer/organic semiconductor layer (pentacene)/source and drain electrodes (carbon thin film) structure.

Electronics have been described above with reference to FIGS. 3 to 5, but are not limited thereto. For example, the second electrode 170 of the organic light-emitting diode 100 of FIG. 3 may be the carbon thin film according to the material used to form the first electrode 10. In addition, although FIG. 5 shows a bottom-gate type organic thin film transistor, organic thin film transistors having various structures such as a top-gate type organic thin film transistor may also be used. The carbon thin film according to the current embodiment may also be used to form electrodes and used as active materials in electronics such as memories, electrochemical/bio sensors, RF devices, rectifiers, and complementary metal oxide semiconductor (CMOS) devices, or electrochemical devices such as lithium batteries and fuel cells. However, the application fields are not limited thereto.

Hereinafter, one or more embodiments will be described in detail with reference to the following examples. However, theses examples are not intended to limit the purpose and scope of the invention.

EXAMPLES

Example 1

A silicon substrate (2.0 cm×2.0 cm) on which a silicon oxide layer having a thickness of 300 nm is formed was prepared and the surface of the silicon oxide layer was hydrophilically modified by treating the surface of the silicon oxide layer with UV light/ozone for 30 minutes.

A 2 wt % solution prepared by dissolving polystyrene (weight average molecular weight (Mw): 130000 g/mol, manufactured by Sigma-Aldrich) in dimethylformamide (DMF, manufactured by DAE JUNG Chemicals) solvent was spin coated on the silicon oxide layer, and baked at 100° C. for 3 minutes to remove the solvent, resulting in forming a polystyrene layer having a thickness of 10 nm.

Nickel (Ni) was deposited on the polystyrene layer to form a Ni protective layer having a thickness of 50 nm, and then the substrate was disposed in a quartz tube and installed in a furnace. The substrate was heat-treated at 1000° C. for 1 minute using a halogen lamp heat source while uniformly flowing argon (Ar) gas (50 sccm) and hydrogen gas (10 sccm) in the quartz tube.

After the heat-treatment, the quartz tube including the substrate was separated from the furnace and naturally cooled. Then, the carbon thin film was separated from the substrate. The carbon thin film has a size of 2.0 cm×2.0 cm and a thickness of 10 nm. Conductivity of the carbon thin film measured using a 4-point probe was 95 S/cm.

Example 2

A carbon thin film was obtained in the same manner as in Example 1, except that polyacrylonitrile (weight average molecular weight (Mw): 150000 g/mol, manufactured by Sigma-Aldrich) was used instead of the polystyrene. Conductivity of the carbon thin film measured using a 4-point probe was 100 S/cm.

Example 3

A carbon thin film was obtained in the same manner as in Example 1, except that polymethyl methacrylate (number average molecular weight (Mn): 130000 g/mol) was used instead of the polystyrene. Conductivity of the carbon thin film measured using a 4-point probe was 105 S/cm.

Example 4

A carbon thin film was obtained in the same manner as in Example 2, except that the thickness of the Ni protective layer was 25 nm instead of 50 nm. Conductivity of the carbon thin film measured using a 4-point probe was 25 S/cm.

Example 5

A carbon thin film was obtained in the same manner as in Example 2, except that the thickness of the Ni protective layer was 10 nm instead of 50 nm. Conductivity of the carbon thin film measured using a 4-point probe was 10 S/cm.

Comparative Examples 1 to 3

Experiments were performed in the same manner as in Examples 1 to 3, except that the Ni protective layer was not formed.

Comparative Example 4

An experiment was performed in the same manner as in Example 1, except that a Ni layer having a thickness of 400 nm was formed on a silicon oxide layer, a polystyrene layer was formed thereon, and a Ni protective layer was not formed on the polystyrene layer.

Comparative Example 5

An experiment was performed in the same manner as in Example 2, except that a Ni layer having a thickness of 400 nm was formed on a silicon oxide layer, a polyacrylonitrile layer was formed thereon, and a Ni protective layer was not formed on the polyacrylonitrile layer.

Comparative Example 6

An experiment was performed in the same manner as in Example 3, except that a Ni layer having a thickness of 400 nm was formed on a silicon oxide layer, a polymethyl methacrylate layer was formed thereon, and a Ni protective layer was not formed on the polymethyl methacrylate layer.

Example 6

A silicon substrate (2.0 cm×2.0 cm) on which a silicon oxide layer having a thickness of 300 nm is formed was prepared and the surface of the silicon oxide layer was hydrophilically modified by treating the surface of the silicon oxide layer with UV light/ozone for 30 minutes.

A 2 wt % solution prepared by dissolving polyacetylonitrile (weight average molecular weight (Mw): 15,000 g/mol) in DMF solvent was spin coated on the silicon oxide layer, and baked at 160° C. for 3 minutes to remove the solvent, resulting in forming a polyacetylonitrile layer having a thickness of 25 nm.

The polyacetylonitrile layer was pre-heat-treated at 250° C. under atmospheric conditions for 10 hours so that at least one portion of the polyacetylonitrile contained in the polyacetylonitrile layer was converted into stabilized polyacetylonitrile.

Then, Ni was deposited on the polyacetylonitrile layer to form a Ni protective layer having a thickness of 300 nm, and then the substrate was disposed in a quartz tube and installed in a furnace. The substrate was heat-treated at 600° C. for 3 hours using a halogen lamp heat source while uniformly flowing argon (Ar) gas (50 sccm) and hydrogen gas (10 sccm) in the quartz tube.

After the heat-treatment, the quartz tube including the substrate was separated from the furnace and naturally cooled.

Then, the carbon thin film was separated from the substrate. The carbon thin film has a size of 2.0 cm×2.0 cm and a thickness of 10 nm. Conductivity of the carbon thin film measured using a 4-point probe was 100 S/cm.

Example 7

A carbon thin film having a size of 2.0 cm×2.0 cm and a thickness of 5 nm was obtained in the same manner as in Example 6, except that the heat-treatment was performed at 1000° C. for 15 minutes. Conductivity of the carbon thin film measured using a 4-point probe was 110 S/cm.

Example 8

A carbon thin film having a size of 2.0 cm×2.0 cm and a thickness of 10 nm was obtained in the same manner as in Example 6, except that a copper (Cu) protective layer having a thickness of 300 nm was formed instead of the Ni protective layer having a thickness of 300 nm. Conductivity of the carbon thin film measured using a 4-point probe was 10 S/cm.

Example 9

A carbon thin film having a size of 2.0 cm×2.0 cm and a thickness of 20 nm was obtained in the same manner as in Example 6, except that the heat-treatment was performed at 1500° C. for 10 hours. Conductivity of the carbon thin film measured using a 4-point probe was 200 S/cm.

Example 10

A carbon thin film having a size of 2.0 cm×2.0 cm and a thickness of 10 nm was obtained in the same manner as in Example 6, except that a polymethyl methacrylate layer (weight average molecular weight (Mw) of polymethyl methacrylate: 15,000) was used instead of the polyacrylonitrile layer. Conductivity of the carbon thin film measured using a 4-point probe was 95 S/cm.

Evaluation Example 1

Figure 7:
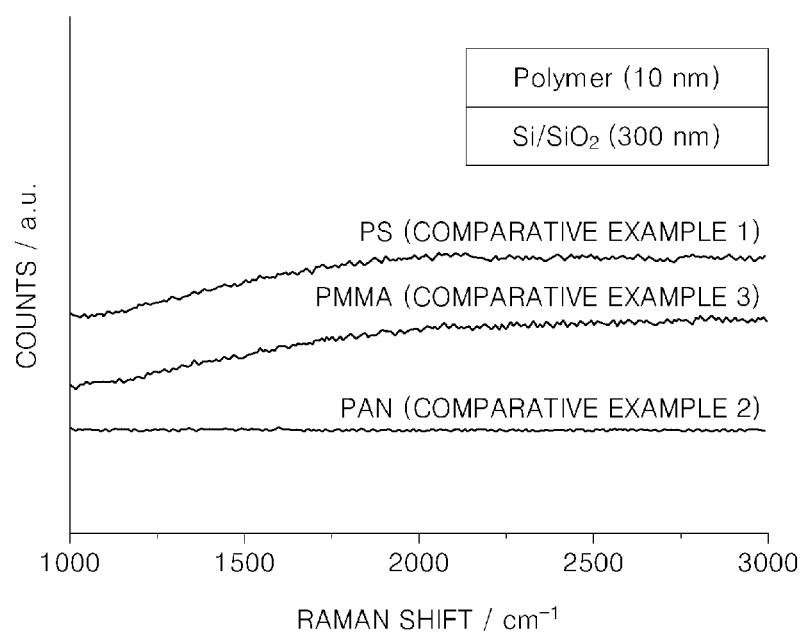
FIG. 7 is a graph illustrating Raman spectra of carbon thin films prepared in Comparative Examples 1 to 3.
Figure 8:
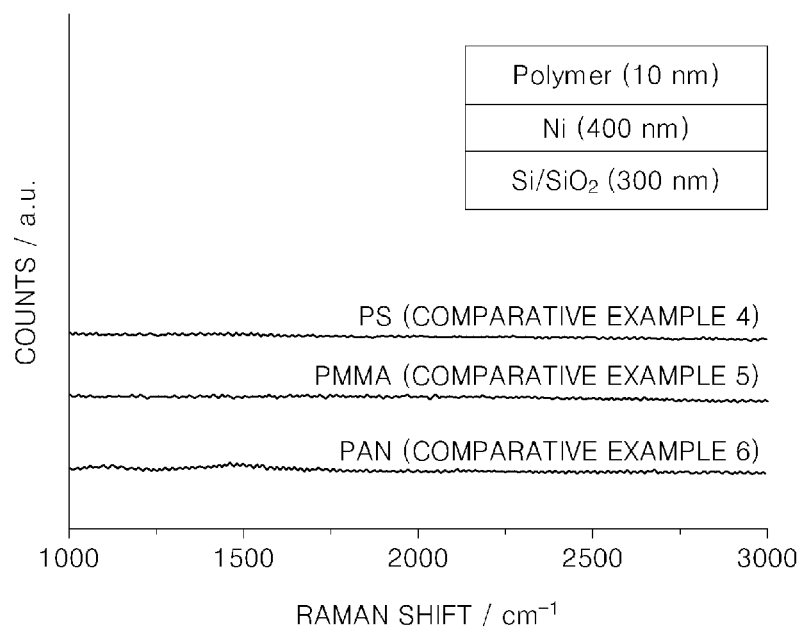
FIG. 8 is a graph illustrating Raman spectra of carbon thin films prepared in Comparative Examples 4 to 6.

Raman spectra of carbon thin films prepared according to Examples 2, 4, and 5 were measured using a SENTERRA Dispersive Raman Microscope manufactured by BRUKER, and the results are shown in FIG. 6. Raman spectra were obtained using a 50× objective lens and a laser having a wavelength of 532 nm at room temperature. FIG. 7 is a graph illustrating Raman spectra of carbon thin films obtained in Comparative Examples 1 to 3. FIG. 8 is a graph illustrating Raman spectra of carbon thin films obtained in Comparative Examples 4 to 6. Referring to FIGS. 6 to 8, the carbon thin films prepared in Examples 2, 4, and 5 show peaks of characteristics of graphene, while the carbon thin films prepared in Comparative Examples 1 to 6 do not show peaks of the characteristics of graphene.

Evaluation Example 2

Figure 9:
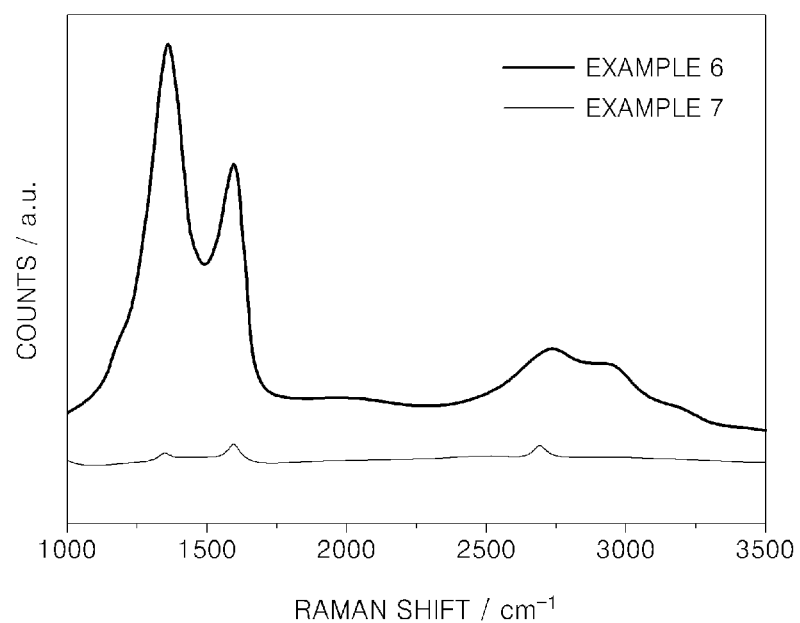
FIG. 9 is a graph illustrating Raman spectra of carbon thin films prepared in Examples 6 and 7.

Raman spectra of carbon thin films prepared according to Examples 6 and 7 were measured using a SENTERRA Dispersive Raman Microscope manufactured by BRUKER, and the results are shown in FIG. 9. Raman spectra were obtained using a 50× objective lens and a laser having a wavelength of 532 nm at room temperature.

Because the carbon thin film prepared in Example 6 shows a Raman shift value of about 1362 cm$^{-1}$ to 1597 cm$^{-1}$ and a strong broad band in FIG. 9, it can be seen that the carbon thin film is amorphous carbon thin film. These properties may be caused by the temperature of the heat-treatment in Example 6. According to the Raman spectrum of the carbon thin film, the carbon thin film prepared in Example 7 is graphene. In this regard, a peak the carbon thin film of Example 7 at 1346 cm$^{-1}$ is derived from a remaining CN group or a defect of the carbon thin film.

According to the method of preparing a carbon thin film, a cost-effective, stable, large-area, and two-dimensional carbon thin film may be efficiently prepared. In addition, the carbon thin film may have excellent conductivity, and thus it may be applied to various conductive electrodes or wirings.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of preparing a carbon thin film, the method comprising:
   forming a polymer layer on a substrate by using a coating process;
   forming a protective layer of a metal layer consisting of metal on the polymer layer; and
   heat-treating the substrate to form a carbon thin film on the substrate,
   wherein the protective layer has a thickness of 10 nm to 300 nm,
   wherein the heat-treatment is performed at 600° C. to 1500° C. for 30 seconds to 15 minutes, and
   wherein the carbon thin film consists of a graphene monolayer or a few layer grapheme having 2 to 10 graphene monolayers.

2. The method of claim 1, wherein the substrate comprises silicon, a silicon oxide, metal foil, stainless steel, a metal oxide, a highly ordered pyrolytic graphite (HOPG), hexagonal boron nitride (h-BN), a c-plane sapphire wafer, zinc sulfide (ZnS), a polymer substrate, or a combination of at least two of the foregoing.

3. The method of claim 1, wherein a polymer of the polymer layer comprises an insulating polymer that comprises carbon and hydrogen, has a thermal decomposition temperature of 600° C. or less, and includes a non-conjugated main chain.

4. The method of claim 1 wherein a polymer of the polymer layer comprises at least one selected from the group consisting of a repeating unit represented by Formula 1 below, a repeating unit represented by Formula 2 below, and a repeating unit represented by Formula 3 below:

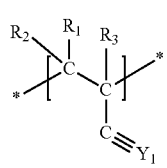

Formula 1

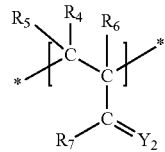

Formula 2

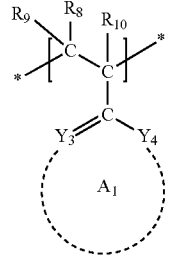

Formula 3 wherein $Y_1$ is N or $C(R_{11})$;
$Y_2$ is O, S, $N(R_{12})$, or $C(R_{13})(R_{14})$;
$Y_3$ and $Y_4$ are each independently N or $C(R_{15})$;
$R_1$ to $R_{10}$ are each independently selected from the group consisting of a hydrogen atom (H), a nitro group (—NO$_2$), a cyano group (—CN), a hydroxyl group (—OH), a carboxyl group (—COOH), a halogen atom, a substituted or unsubstituted $C_1$-$C_{30}$ alkyl group, a substituted or unsubstituted $C_1$-$C_{30}$ alkoxy group, a substituted or unsubstituted $C_6$-$C_{30}$ aryl group, a substituted or unsubstituted $C_6$-$C_{30}$ arylalkyl group, a substituted or unsubstituted $C_6$-$C_{30}$ aryloxy group, a substituted or unsubstituted $C_2$-$C_{30}$ heteroaryl group, a substituted or unsubstituted $C_2$-$C_{30}$ heteroarylalkyl group, a substituted or unsubstituted $C_2$-$C_{30}$ heteroaryloxy group, a substituted or unsubstituted $C_5$-$C_{20}$ cycloalkyl group, a substituted or unsubstituted $C_2$-$C_{30}$ heterocycloalkyl group, a substituted or unsubstituted $C_1$-$C_{30}$ alkylester group, a substituted or unsubstituted $C_6$-$C_{30}$ arylester group, a substituted or unsubstituted $C_2$-$C_{30}$ heteroarylester group, and —N(Q$_1$)(Q$_2$), $R_{11}$ to $R_{15}$ are each independently selected from the group consisting of a hydrogen atom (H), a nitro group (—NO$_2$), a cyano group (—CN), a hydroxyl group (—OH), a carboxyl group (—COOH), a halogen atom, a $C_1$-$C_{10}$ alkyl group, a $C_1$-$C_{10}$ alkoxy group, and N(Q$_1$)(Q$_2$), wherein Q$_1$ to Q$_2$ are each independently selected from the group consisting of a hydrogen atom, a $C_1$-$C_{30}$ alkyl group, a $C_6$-$C_{30}$ aryl group, and a $C_2$-$C_{30}$ heteroaryl group;
$A_1$ is a substituted or unsubstituted $C_6$-$C_{30}$ aryl group or a substituted or unsubstituted $C_2$-$C_{30}$ heteroaryl group; and
the * is a binding site with an adjacent repeating unit.

5. The method of claim 4, wherein the polymer comprises the repeating unit represented by Formula 1, wherein $Y_1$ is N.

6. The method of claim 4, wherein the polymer comprises the repeating unit represented by Formula 2, wherein $Y_2$ is O.

7. The method of claim 4, wherein the polymer comprises the repeating unit represented by Formula 3, wherein $A_1$ is a substituted or unsubstituted phenyl group, a substituted or unsubstituted naphthyl group, or a substituted or unsubstituted pyridinyl group.

8. The method of claim 1, wherein the forming the polymer layer comprises providing a first mixture comprising the polymer and a solvent or a second mixture including a precursor of the polymer and a solvent to the substrate by using a coating process.

9. The method of claim 1, wherein the protective layer comprises a material having a melting point of 800° C. or higher.

10. The method of claim 1, wherein the metal is at least one selected from the group consisting of copper (Cu), nickel (Ni), palladium (Pd), gold (Au), silver (Ag), aluminum (Al), molybdenum (Mo), and a combination of at least two of the foregoing.

11. The method of claim 1, wherein the heat-treatment is performed under conditions where polymers contained in the polymer layer are carbonized.

12. The method of claim 1, wherein the heat-treatment is performed in an inert or vacuum atmosphere.

13. The method of claim 1, further comprising at least one step selected from the group consisting of patterning the protective layer and/or the polymer layer in order to have desired micro- or nano-scale patterns before performing the heat-treatment and patterning the carbon thin film in order to have desired micro- or nano-scale patterns after performing the heat-treatment.

14. The method of claim 1, further comprising forming a catalyst layer on the substrate before forming the polymer layer.

15. The method of claim 14, wherein the catalyst layer comprises nickel (Ni), cobalt (Co), iron (Fe), gold (Au), aluminum (Al), chromium (Cr), copper (Cu), magnesium (Mg), molybdenum (Mo), rhodium (Rh), silicon (Si), tantalum (Ta), titanium (Ti), tungsten (W), uranium (U), vanadium (V), zirconium (Zr), or a combination of at least two of the foregoing.

16. The method of claim 14, further comprising removing the catalyst layer after forming the carbon thin film.

17. The method of claim 1, further comprising stabilizing the polymer layer by pre-heat-treating the polymer layer before forming the protective layer,
wherein the pre-heat-treatment is performed at a temperature in the range of 200° C. to 350° C.

18. The method of claim 1, further comprising removing the protective layer after forming the carbon thin film.

19. The method of claim 1, further comprising transferring the prepared carbon thin film to another substrate.

* * * * *